United States Patent [19]

Rosso et al.

[11] 4,001,701
[45] Jan. 4, 1977

[54] CIRCUIT FOR COMBINING PULSE TRAINS

[75] Inventors: John B. Rosso; Sheyrl Wayne Garrett, both of Tulsa, Okla.

[73] Assignee: Combustion Engineering, Inc., Windsor, Conn.

[22] Filed: Sept. 25, 1975

[21] Appl. No.: 616,789

[52] U.S. Cl. .............................. 328/158; 328/110; 307/247 R
[51] Int. Cl.² ..................... G06G 7/02; H03K 3/78
[58] Field of Search .......... 328/133, 134, 158, 159, 328/110; 307/247 R

[56] References Cited
UNITED STATES PATENTS

| | | | |
|---|---|---|---|
| 3,200,340 | 8/1965 | Dunne | 328/134 X |
| 3,710,140 | 1/1973 | Volmerange | 328/133 |
| 3,735,324 | 5/1973 | Phillips | 328/133 |

*Primary Examiner*—John S. Heyman
*Attorney, Agent, or Firm*—Arthur L. Wade

[57] ABSTRACT

An electric circuit with a plurality of inputs, each input receiving a train of pulses. Each pulse of each train sets a latch of cross-coupled logic gates to an output of logic 1. A clock generating regular voltage pulses is connected in parallel to the latches so as to reset the output of each gate to logic 0 in series with each other. The plurality of outputs from the latches is passed through a common gate to form the output train of pulses as an addition of the plural inputs.

3 Claims, 1 Drawing Figure

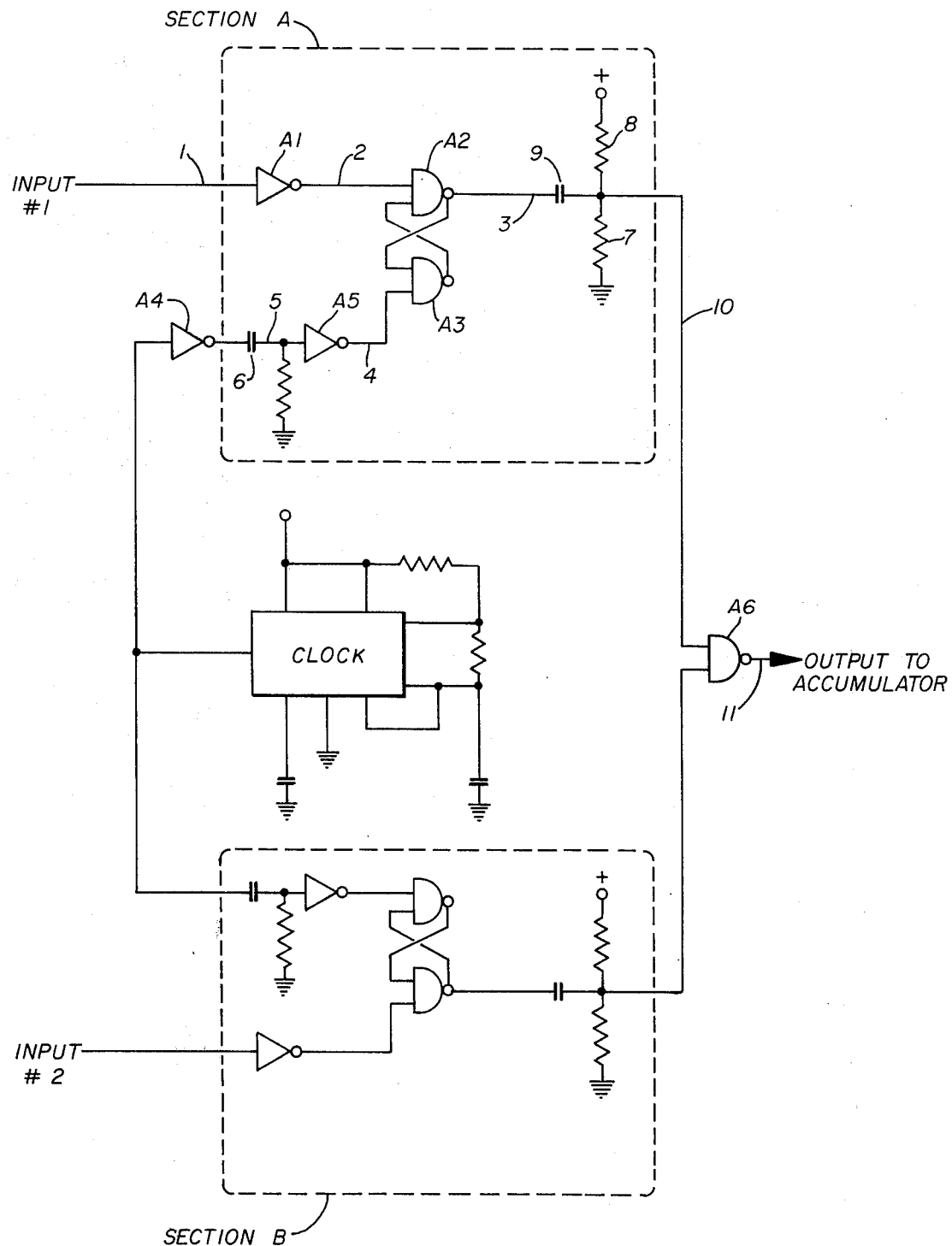

CIRCUIT FOR COMBINING PULSE TRAINS

BACKGROUND OF THE INVENTION

1. Field

This invention adds quantitative signals from a plurality of sources. More specifically the signals from each source are stored separately and released in sequence from the plurality of storage points by signals from a third source.

2. Prior Art

By some standards, the need to provide a single point of addition for a number of quantity indications is esoteric. However, there is such need.

We recognize there are many ways to approach the problem. However, where the primary element directly interfacing with the quantitative variable generates a train of voltage pulses, a particular system for processing the pulses is required. Where there is a plurality of pulse trains to be combined into a single train, provision for storing each train must be made. A release of each train, for the combination, must be provided so the pulses of each train may be meshed, added, for the single point of manifestation.

All of the storing, releasing and addition functions must be performed. The prior art which I have studied does not carry out these functions with logic gate latches released by a voltage pulse generator clock.

SUMMARY OF THE INVENTION

The invention processes a multiple of signal trains into a single train which is a total of the quantity represented by the trains. The invention is embodied in an electric circuit which receives the trains in the form of a series of voltage pulses. The circuit is divided in sections, each section receiving a pulse train. Each pulse of the train is applied to a latch of cross coupled logic gates. The latch output is carried to logic 1 by each pulse and returned to logic 0 by a clock pulse. The return to logic 0 generates in the output of the circuit a voltage pulse and in sequence with pulses from other sections.

Other objects, advantages and features of the invention will be apparent to those skilled in the art from the written specifications, claims and drawings, i.e., the disclosure.

The drawing is a diagrammatic circuit embodying the invention.

DESCRIPTION OF THE PREFERRED EMBODIMENT

The circuit disclosed in the drawing receives signals on a quantitative basis. The number of signals equals the amount of whatever material generated the signals. The more common example is fluid flow. As the fluid passes a position, it generates a signal for each increment of fluid which passes the position.

The circuit embodying the invention will receive the signal in the form of surges of voltage. The primary element directly responding to the flowing fluid will generate a pulse of voltage for each flowing fluid increment. These voltage pulses will be fed into the circuit at more than one position. The circuit is so arranged as to add the pulses from the positions and flow them from the circuit in one train. An accumulation does not form a part of the invention, but it can receive the pulse train and display it as a total flow of two or more fluid streams.

The plural number of inputs are received by separate input sections of the circuit. The pulses to each section may be received sequentially or at the same time.

Within each circuit section, the pulses received are stored in latches. A generated train of pulses is then applied to the sections to serially transfer the stored pulses from the latches. The generator of the pulse train which triggers the latches will be termed here a "clock."

The embodying circuit is built around the so-called logic circuits. Those skilled in the art have used both the NAND gate and NOR gate. It is simply a matter of design which is selected for the present circuit. The circuit will be disclosed with the use of the NAND gate which was convenient when the invention was first reduced to practice.

Each section of the circuit includes a couple of NAND gates connected as cross coupled latches. The signal, as a voltage pulse, is inverted to set the output of the latch to logic 1. The clock pulse feed will reset the latch output to logic 0 which, on the output gate of the circuit appears as a voltage pulse. Each section of the circuit sequentially has any logic 1 latch output lowered by a clock pulse to appear at the output gate. Accumulated, the pulses from the output gate may be registered as a total of all inputs to the circuit sections.

In the drawing, the circuit is disclosed with only two sections A and B and a voltage generator, or clock.

SECTION A

Input lead 1 to section A is connected to the input of inverter A1. Actually, a NAND gate with inputs connected will function as an inverter. In any event, inverter A1 receives a positive input pulse of voltage and converts it to an output voltage pulse which is in the opposite direction of the input. It is a matter of magnitudes. An increase in input voltage is inverted to a decrease in output voltage. Lead 2 places the inverted input on the section A latch.

The section A latch comprises NAND gates A2 and A3, connected as disclosed. The inverted pulse signal applied to one of the two input leads of the latch causes the output of A2 to go to logic 1. Logic 0 is applied by lead 2 and logic 1 is applied to lead 3 through A2 of the latch. Logic 1 remains on lead 3 until returned to logic 0 by a clock pulse. It is this shift from logic 1 to logic 0 on lead 3 that generates the output of this section of the circuit.

Keep in mind that the logic 1 on lead 3 is applied to one input of A3, the other NAND gate of the latch. The second input to A3 is also at logic 1, making the output of A3 to go to logic 0. The logic 0 output of A3 on the input of A2 latches in the logic 1 as an output of A2. Then, nothing happens until a clock pulse changes the logic 1 on the second input to A3. This logic 1 on lead 4 to A3 is sustained by inverter A5. The input to A5 is normally at logic 0. It is disclosed as connected to ground. Therefore, the output to lead 4 is logic 1.

Note that lead 5 to inverter A5 has a capacitor 6. Therefore, each change in input to capacitor 6 from logic 0 to logic 1 will cause a quick change in the output of inverter A5 to logic 0. This simple change will shift the logic 1 of lead 3 to logic 0. Only this shift from logic 1 to logic 0 on lead 3 generates an output voltage pulse from the circuit. How does the clock voltage output function to transfer the change from logic 1 to logic 0 of the latch to the output as a voltage pulse?

THE CLOCK

The clock circuit is a stable, cyclic source of voltage pulses. The change in forming the leading and trailing edges of each clock pulse gives the desired result.

Each clock pulse is applied to both section A and section B in parallel. However, the pulse to one section is inverted. Specifically, A4 is shown connected to invert the clock pulse to section A.

Remember, only the change on capacitors at the entrances of each section from low to high values will lower the lead 4 signal to transfer the pulse latched on lead 3. As the clock pulse is inverted, as between the sections A and B, the readout from the section latches will alternate, the resulting pulses fed sequentially to the circuit output gate A6.

LATCH OUTPUT CIRCUIT

Each input to A6 is provided a positive voltage, or logic 1, from a divider circuit comprised of resistances 7 and 8. This divider circuit is tied to lead 3 through capacitor 9. Therefore, as the latch output shifts from logic 1 to logic 0, the voltage on lead 10 changes downward, to be inverted by A6 to a positive output voltage pulse on lead 11.

Sections A and B alternate in supplying signals to output lead 11. They alternate because the triggering clock pulses are inverted into one of the sections. If a logic 1 is found on a latch output it is transferred to lead 11 by the clock pulse edge which shifts the logic 0 of lead 5 to logic 1. But the clock pulse inversion dictates this shift to occur alternately, as between sections.

CONCLUSION

The circuit is built around pairs of logic gate circuits. Each pair of gates is connected to each other as a cross-coupled latch. The input of a voltage pulse sets the output to logic level 1. The pulse is "stored" on the latch. The pulse is released by the edge of a pulse generated by a "clock."

Each of section A and section B has its own latch, independently receiving its input pulses in a train. Each section receives each pulse to set its latch.

Next, a generator of a pulse train supplies its output to the sections and their latches in parallel. The edges of these clock pulses resets the latches of the sections. In the pair of sections disclosed, the clock output to one of the sections is inverted so that the latches will be reset alternately, in sequence.

The change in latch output is applied to a resistance divider circuit which generates a voltage output when the latch output is reset. This voltage pulse generation, from the plurality of sections, is formed into a single pulse train through a final logic gate.

From the foregoing, it will be seen that this invention is one well adapted to attain all of the ends and objects hereinabove set forth, together with other advantages which are obvious and inherent to the apparatus.

It will be understood that certain features and subcombinations are of utility and may be employed without reference to other features and subcombinations. This is contemplated by and is within the scope of the invention.

As many possible embodiments may be made of the invention without departing from the scope thereof, it is to be understood that all matter herein set forth or shown in the accompanying drawings is to be interpreted in an illustrative and not in a limiting sense.

The invention, having been described, what is claimed is:

1. A circuit arranged to respond to a plurality of voltage pulse trains and generate a single voltage pulse train which is an addition of the plurality of trains, including;
   a first circuit section connected to a first of the input pulse trains, including,
   a. a pair of logic gate circuits connected as a cross coupled latch and connected to receive the pulses of the input to the section and generate an output logic 1,
   b. a connection between the output of an independent, stable source of voltage pulses and the cross coupled latch through which a first of the edges of the pulses shifts the latch output to logic 0.
   c. and a resistance divider circuit means capacitively connected to said latch and responding to only the shift in the latch output to logic 0 to generate a voltage pulse in the output of the circuit;
   and a second circuit section connected to a second of the input pulse trains which generates a voltage pulse in the output of the circuit with the second of the edges of the pulses of the stable source of voltage pulses,
   whereby the differential source pulses generates a pulse train output of the circuit from the plurality of input pulse trains.

2. A circuit connected to a plurality of voltage pulse trains, including;
   a section for receiving each pulse train, each section including;
   a. a pair of logic gate circuits connected to form a cross-coupled latch and receiving the pulse train to the section as one of two inputs,
   b. a resistance divider circuit means capacitively connected to the output of the latch so as to generate an output voltage pulse as the latch output shifts in a predetermined direction,
   c. and a source of independent stable, cyclic voltage pulses connected to the latch as the other of the two inputs, a selected edge of each pulse shifting the latch output in the predetermined direction;
   whereby the output voltage pulses from the circuit means of each section is sequentially formed into an output of the circuit as a single pulse train.

3. The circuit of claim 2 in which the pair of logic gate circuits are NAND gates which receive each pulse to their section for generation of an output logic 1 and the circuit means generates its output voltage pulse as the logic 1 output is shifted to logic 0.

* * * * *